United States Patent [19]
Yamazaki

[11] Patent Number: 5,323,055
[45] Date of Patent: Jun. 21, 1994

[54] SEMICONDUCTOR DEVICE WITH BURIED CONDUCTOR AND INTERCONNECTION LAYER

[75] Inventor: Tatsuya Yamazaki, Kawasaki, Japan
[73] Assignee: Fujitsu Limited, Kawasaki, Japan
[21] Appl. No.: 747,977
[22] Filed: Aug. 21, 1991

[30] Foreign Application Priority Data
Aug. 27, 1990 [JP] Japan .................................. 2-222379

[51] Int. Cl.⁵ ...................... H01L 29/72; H01L 29/06
[52] U.S. Cl. ................................... 257/588; 257/554;
257/559; 257/565; 257/583; 257/586
[58] Field of Search ............... 257/552, 554, 559, 565,
257/583, 584, 586, 587, 588

[56] References Cited
FOREIGN PATENT DOCUMENTS

| | | | |
|---|---|---|---|
| 60-89970 | 5/1985 | Japan | 257/587 |
| 60-187055 | 9/1985 | Japan | 257/565 |
| 1-80075 | 3/1989 | Japan | 257/565 |

*Primary Examiner*—Ngan Ngo
*Attorney, Agent, or Firm*—Staas & Halsey

[57] ABSTRACT

A semiconductor device includes an insulating support layer on which are mounted, in succession, a conductive layer, a buried layer comprising first and second spaced portions and a semiconductor single crystal layer comprising spaced first and second portions respectively supported on the first and second spaced portions of the buried layer, the respective first and second portions having respective, first and second common sidewalls defining respective, first and second peripheries thereof and respectively comprising a transistor region and a collector electrode region. A remaining exposed surface portion of the conductive layer extends between the spaced, opposing portions of the sidewalls of the transistor and collector electrode regions. An insulating material layer is supported on the first portion remaining exposed surface portion of the conductive layer and extending between and engaging the spaced and opposed portions of the peripheral sidewalls of the transistor and collector electrode regions, and a second portion engaging and extending from the remaining portions of the peripheral sidewalls of the transistor and collector electrode regions. The conductive layer electrically couples the transistor region and the collector electrode region and further comprises an electrical interconnection layer.

7 Claims, 5 Drawing Sheets

SEMICONDUCTOR DEVICE WITH BURIED CONDUCTOR AND INTERCONNECTION LAYER

BACKGROUND OF THE INVENTION

The present invention generally relates to semiconductor devices and methods of producing semiconductor devices and, more particularly, to a semiconductor device such as a bipolar transistor having a means for connecting a collector layer of the bipolar transistor to a collector electrode or another circuit element, and a method of producing such a semiconductor device.

Conventionally, a bipolar transistor is provided with a device isolation structure such as a U-groove and a pn junction, for the purpose of isolating the bipolar transistor from other elements. A relatively thick field oxide layer is provided in order to reduce the capacitance between a base electrode and a collector layer, and in addition, a collector buried layer having a high impurity concentration is provided so as to connect the collector layer to a collector electrode at a low resistance.

A description will be given of a method of producing an example of a conventional bipolar transistor, by referring to FIGS. 1A through 1F.

As shown in FIG. 1A, n-type impurities are injected into a p-type semiconductor substrate 21 to form an $n^+$-type buried layer 22, and an n-type layer 23 is epitaxially grown on the $n^+$-type buried layer 22.

Then, silicon nitride layers 24 and 25 are respectively formed in a region where the transistor is to be formed and in a region where a collector electrode of the transistor is to be formed.

Next, as shown in FIG. 1B, the semiconductor substrate 21 formed with the silicon nitride layers 24 and 25 is oxidized to form a LOCOS type field oxide layer 26.

As shown in FIG. 1C, a U-groove 27 which penetrates the field oxide layer 26 and reaches the semiconductor substrate 21 is formed. This U-groove 27 penetrates the field oxide layer 26 which defines the outer periphery of the transistor. Hence, the region where the transistor is to be formed and the region where the collector electrode is to be formed are isolated from other regions. A silicon oxide layer 28 is thereafter formed on the inner surface of the U-groove 27.

Next, as shown in FIG. 1D, a polysilicon layer 29 is formed on the surface of the semiconductor substrate 21, including the inside of the U-groove 27, by a chemical vapor deposition (CVD).

Thereafter, as shown in FIG. 1E, the polysilicon layer 29 is polished to obtain a planarized surface, and the polished polysilicon layer 29 is further subjected to a controlled etching so as that the polysilicon layer 29 only remains inside the U-groove 27. In addition, the silicon nitride layers 24 and 25 are removed.

The top of the polysilicon layer 29 inside the U-groove 27 is oxidized to form a silicon oxide cap 30.

Therefore, a transistor region 31 in which the transistor is to be formed and a collector electrode region 32 in which the collector electrode is to be formed, are respectively formed by the above described process.

Next, as shown in FIG. 1F, p-type impurities and n-type impurities are successively injected into the transistor region 31 to form a base layer 33 and an emitter layer 34 of the transistor. In addition, n-type impurities are injected into the collector electrode region 32 to form a low resistance $n^{++}$-type region 35 which reaches the buried layer 22.

A base electrode 37, an emitter electrode 38 and a collector electrode 36 are respectively formed on the base layer 33, the emitter layer 34 and the low resistance $n^{++}$-type region 35.

However, the conventional method of producing the bipolar transistor has the following problems.

First, the collector layer must be formed by an epitaxial growth.

Second, since the collector layer is epitaxially grown on the collector buried layer, it is impossible to make the impurity concentration of the buried layer sufficiently high because of the need to maintain satisfactory crystal properties of the epitaxially grown collector layer. For this reason, the resistance between the collector layer and the collector electrode is relatively large.

Third, since the collector layer and the semiconductor substrate make contact over a relatively wide area, the capacitance between the collector layer and the semiconductor substrate is relatively large, thereby preventing a high-speed operation of the transistor.

Fourth, an isolating means such as a U-groove and a pn junction must be formed with a high accuracy in order to provide the necessary device isolation.

Fifth, it is essential to provide the field oxide layer in order to reduce the capacitance between the base electrode and the collector layer. However, when the LOCOS type field oxide layer is employed, the transistor region is relative deep and enlarged. As a result, the capacitance between the collector and base becomes relatively large, thereby preventing a high-speed operation of the transistor.

In other words, there are two factors limiting the operation speed of the bipolar transistor, namely, the base resistance and the base-collector (pn junction) capacitance. In order to reduce the base-collector capacitance so as to improve the operation speed, it is necessary to make the thickness of the LOCOS type field oxide layer large and reduce the area occupied by the bipolar transistor. However, the two cannot be satisfied simultaneously in a satisfactory manner. That is, when the LOCOS type field oxide layer is made thick, the so-called bird's beak is formed on the side of the field oxide layer, and the bird's beaks of adjacent field oxide layer portions connect in extreme cases, thereby making it impossible to form a transistor region between the adjacent field oxide layer portions. For this reason, it is difficult to control the width between the sides of the adjacent field oxide layer portions. Therefore, in order to control the widths of transistor region and the collector electrode region with a high accuracy, it would be preferable not to employ the LOCOS.

SUMMARY OF THE INVENTION

Accordingly, it is a general object of the present invention to provide a novel and useful semiconductor device and method of producing the semiconductor device, in which the problems described above are eliminated.

Another and more specific object of the present invention is to provide a method of producing a semiconductor device comprising the steps of (a) forming a buried layer having a predetermined impurity concentration on one surface of a semiconductor single crystal plate, (b) bonding a substrate made of an insulator material on the one surface of the semiconductor single crystal plate, and (c) forming a transistor on a surface of the semiconductor single crystal plate opposite to the one surface. The method of the present invention produces a transistor capable of operating at a high speed.

Still another object of the present invention is to provide a method of producing a semiconductor device comprising the steps of (a) forming a buried layer having a predetermined impurity concentration on one surface of a semiconductor single crystal plate, (b) forming a conductive layer on the one surface of the semiconductor single crystal plate, (c) bonding a substrate made of an insulator material on the specific layer, and (d) forming a transistor on a surface of the semiconductor single crystal plate opposite to the one surface. According to the method of the present invention, it is possible to produce a transistor capable of operating at a high speed, and in addition, the conductive layer can be used as an interconnection for coupling the transistor to another element.

A further object of the present invention is to provide a method of producing a semiconductor device comprising the steps of (a) forming grooves in a first surface of a semiconductor single crystal plate in regions excluding a transistor region and a collector electrode region, where the transistor region is a region in which a transistor is to be formed on a second surface of the semiconductor single crystal plate opposite to the first surface and the collector electrode region is a region in which a collector electrode of the transistor is to be formed on the second surface of the semiconductor single crystal plate, (b) filling an insulator material in the grooves, (c) injecting impurities into the first surface of the semiconductor single crystal plate within regions defined by the grooves so as to form a buried layer, (d) forming a conductive layer on the first surface of the semiconductor single crystal plate to connect at least portions of the buried layer isolated by the groove, (e) bonding a substrate made of an insulator material on the conductive layer, (f) removing the semiconductor single crystal plate from the second surface to at least bottom surfaces of the grooves so as to expose the transistor region and the collector electrode region which are defined by the grooves, and (g) forming the transistor in the transistor region, including forming the collector electrode in the collector electrode region.

Another object of the present invention is to provide a semiconductor device comprising an insulator layer, a conductive layer provided on the insulator layer, a buried layer provided on the conductive layer, a semiconductor single crystal layer provided on the buried layer, a plurality of grooves penetrating the buried layer and the semiconductor single crystal layer, and an insulator material filling the grooves to define a transistor region and a collector electrode region of the semiconductor single crystal layer. The transistor region is a region in which a transistor is to be formed, the collector electrode region is a region in which a collector electrode of the transistor is to be formed, and the conductive layer couples at least a portion of the buried layer in the transistor region and a portion of the buried layer in the collector electrode region. According to the semiconductor device of the present invention, it is possible to realize a transistor capable of operating at a high speed, and in addition, the conductive layer can be used as an interconnection for coupling the transistor to another element.

Other objects and further features of the present invention will be apparent from the following detailed description when read in conjunction with the accompanying drawings.

DESCRIPTION OF THE PREFERRED EMBODIMENTS

A description will be given of an embodiment of the method of producing the semiconductor device according to the present invention, by referring to FIGS. 2A through 2G.

Figure 1A:
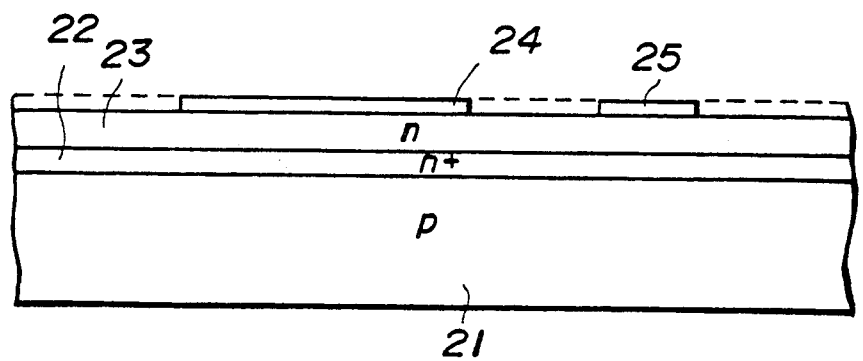
FIGS. 1A through 1F respectively are cross sectional views of a semiconductor device at essential production stages of an example of a conventional method of producing a bipolar transistor.
Figure 1B:
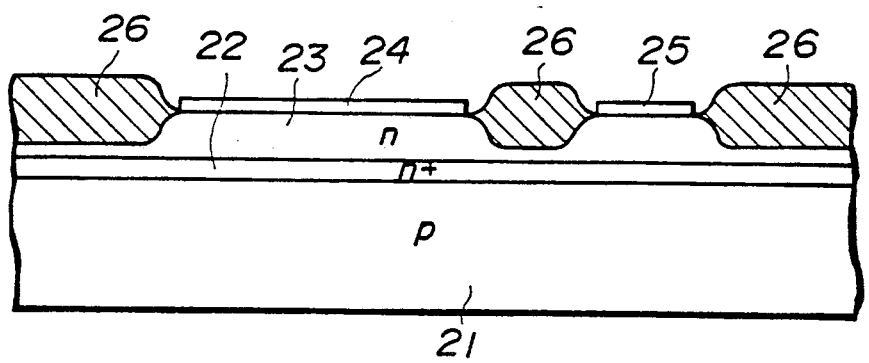
Figure 1C:
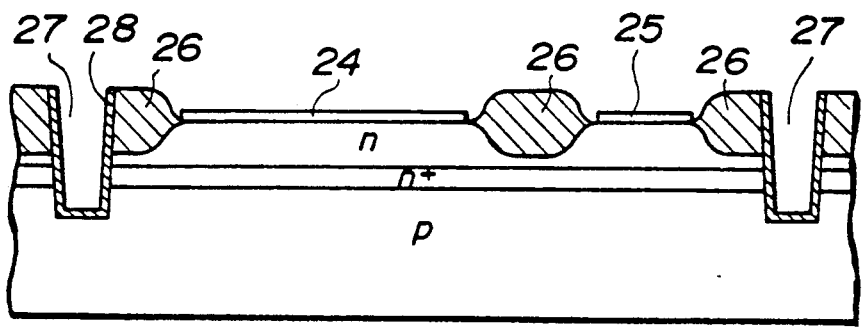
Figure 1D:
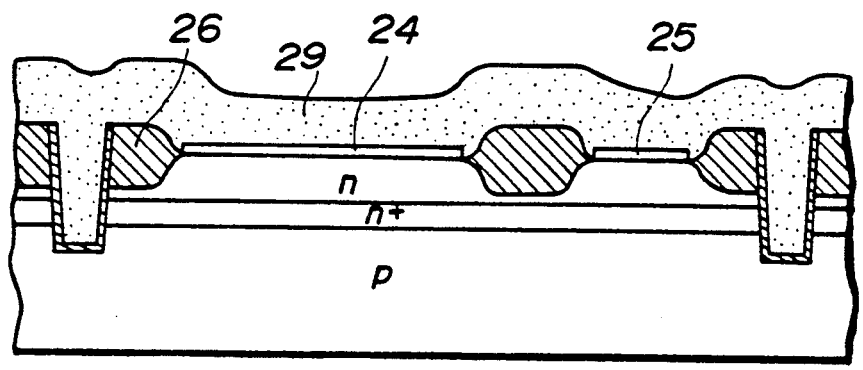
Figure 1E:
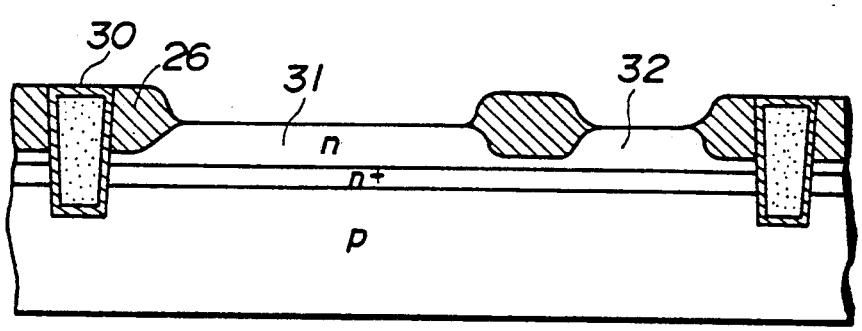
Figure 1F:
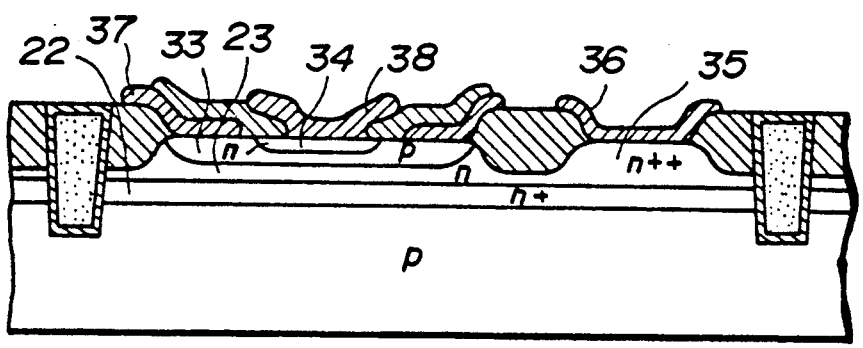
Figure 2A:
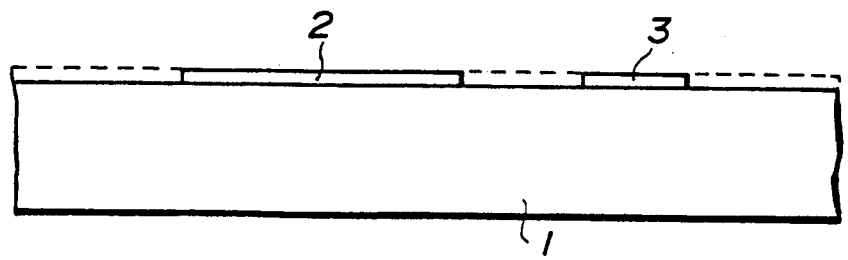
FIGS. 2A through 2G respectively are cross sectional views of a semiconductor device at essential production stages of an embodiment of a method of producing the semiconductor device according to the present invention.
Figure 2B:
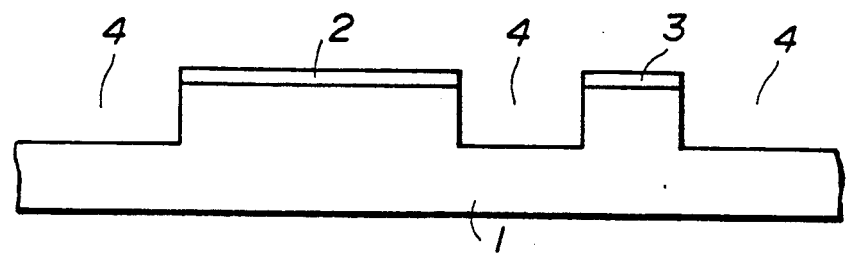

As shown in FIG. 2A, a silicon nitride layer is formed on the entire surface of one side (i.e., a first main surface) of a silicon single crystal plate (i.e. substrate) 1. The silicon nitride layer is removed using a photolithography technique so that the silicon nitride layer remains only in a region 2 where a transistor is to be formed on the other side (i.e., all opposite, second main surface) of the single crystal plate 1 and in a region 3 where a collector electrode of the transistor is to be formed Next, as shown in FIG. 2B, the silicon nitride layer regions 2 and 3 are used as masks, and the surface of the crystal plate 1 is etched so as to form an etched groove 4.

Figure 2C:
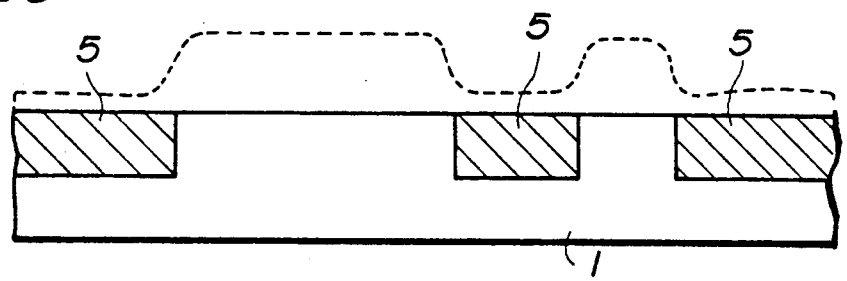

As shown in FIG. 2C, a silicon oxide layer 5 is formed by a CVD on the side of the single crystal plate 1 which includes the etching groove 4. Then, the silicon oxide layer 5 is polished so that the silicon oxide layer 5 remains only within the etched groove 4. In addition, the silicon nitride layer at the regions 2 and 3 is removed by a selective etching.

Figure 2D:
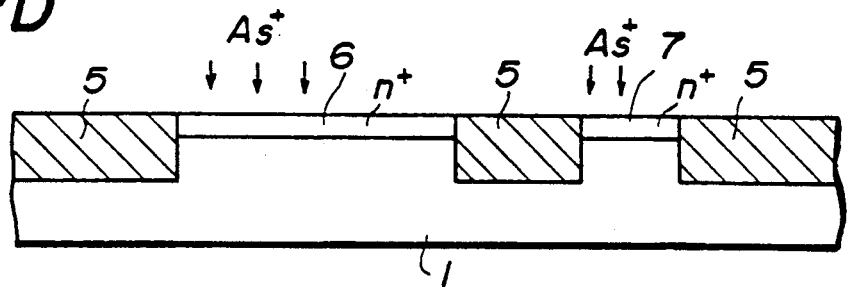

Thereafter, as shown in FIG. 2D, n-type impurities such as arsenic (As) and phosphor (P) are injected into the surface of the single crystal plate 1 where the silicon nitride layer was removed, so as to form $n^+$-type buried layers 6 and 7.

Figure 2E:
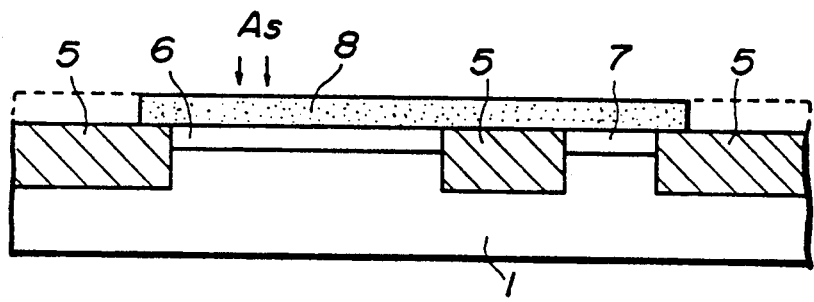

As shown in FIG. 2E, a polysilicon layer is formed by a CVD on the entire surface of the one side of the single crystal plate 1 provided with the $n^+$-type buried layers 6 and 7. The electrical resistance of the polysilicon layer is reduced by injecting impurities such as As and P into the polysilicon layer. Then, the polysilicon layer is removed by an etching so that the polysilicon layer remains only at a region 8 encompassing the $n^+$-type buried layers 6 and 7.

Figure 2F:
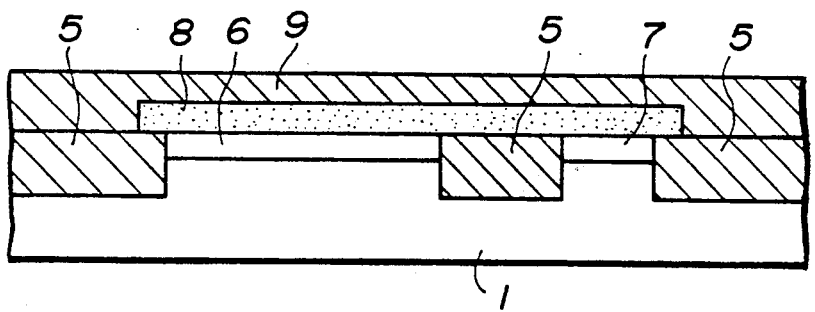

Next, as shown in FIG. 2F, a silicon oxide layer 9 is formed by CVD on the polysilicon layer region 8, and the surface of the silicon oxide layer 9 is planarized.

Figure 2G:
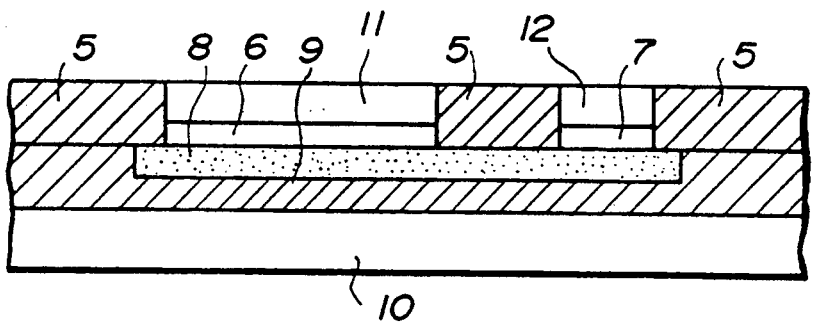

As shown in FIG. 2G, in which the structure of FIG. 9 is inverted, a silicon substrate 10 is bonded on the silicon oxide (insulation) layer 9. For example, the silicon substrate 10 is bonded on the silicon oxide layer 9 by electrostatically adhering the planarized surfaces of the silicon substrate 10 and the silicon oxide layer 9 and subjecting the two to a thermal process at approximately 1000° C. to 1100° C. In this embodiment, the thermal process includes an annealing within a hydrogen (H$_2$) atmosphere.

Thereafter, the surface of the single crystal plate 1 is polished to at least the bottom surface of the etching groove 4 (now filled with silicon oxide 5), so as to define a transistor region 11 in which a transistor is to be formed and a collector electrode region 12 on which a collector electrode of the transistor is to be formed, the regions 11 and 12 being the remaining portions of the singe crystal plate 1 (i.e., substrate of FIGS. 2A–2F).

The bipolar transistor is formed in the transistor region 11 by a known transistor forming method. The collector of this bipolar transistor is coupled to the collector electrode region 12 via the buried layer 6, the polysilicon layer region 8 and the buried conductor layer 7. As a result, an embodiment of the semiconductor device shown in FIG. 3 is produced.

Figure 3:
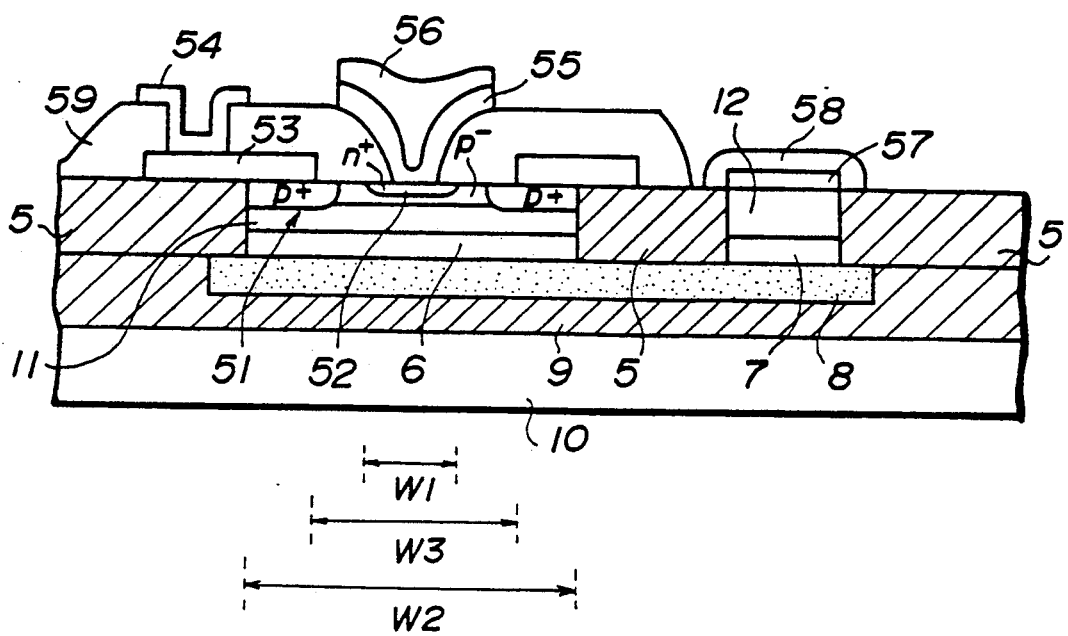
FIG. 3 is a cross sectional view showing an embodiment of the semiconductor device according to the present invention which is produced by the embodiment of the method described in conjunction with FIGS. 2A through 2G.

In FIG. 3, the bipolar transistor includes a p-type base layer 51 which is formed in the transistor region 11, and an n+-type emitter layer 52 which is formed in the base layer 51. The base layer 51 includes a p$^-$-type region which surrounds the emitter layer 52, and p+-type regions which surrounds the p$^-$-type region. A base contact layer 53 made of polysilicon makes contact with the p+-type region of the base layer 51, and an emitter contact layer 55 made of polysilicon makes contact with the emitter region 52. A base electrode 54 makes contact with the base contact layer 53 via a hole which is formed in an insulator layer 59, and an emitter electrode 56 makes contact with the emitter contact layer 55. On the other hand, a collector contact layer 57 makes contact with the collector electrode region 12, and a collector electrode 58 makes contact with the collector contact layer 57.

For example, a width W1 of the emitter layer 52 is 0.2 μm, a width W2 of the transistor region 11 is 0.7 to 1.3 μm, a width W3 between the sides of the base contact layer 53 is 0.5 μm. In this case, the thickness of the silicon oxide layer 5 is 0.5 μm, the thickness of the silicon oxide layer 9 is 1.0 μm, and the thickness of the polysilicon layer 8 is 0.3 μm.

In the above described embodiments, the collector buried layer 6 and the collector electrode region 12 are coupled via the polysilicon layer at the region 8. However, the polysilicon layer region 8 may be replaced by a metal layer having a high withstand voltage. For example, the metal layer may be made of a material selected from a group including doped titanium silicide, titanium (Ti) or tungsten (W) which is formed by CVD or sputtering, tantalum (Ta), and tantalum silicide.

In addition, the polysilicon layer region 8 which couples the collector and the collector electrode may freely be patterned in the exposed stage shown in FIG. 2E. Hence, if needed, the polysilicon layer can be patterned so that the collectors of a plurality of transistors are coupled, or so that the collector of the transistor is coupled to other circuit elements.

Moreover, the semiconductor device of the present invention is not limited to the bipolar transistor of the described embodiment, and may be applied to other semiconductor devices such as a biCMOS device.

According to the present invention, it is possible to obtain the following effects.

First, because the transistor is formed in the single crystal plate (substrate) itself, it is unnecessary to epitaxially grow a collector layer as in the case of the conventional method.

Second, since the bottom surface of the collector layer is exposed at the initial stage of the production and no single crystal layer is thereafter grown on this bottom surface, it is possible to freely set the impurity concentration distribution of this bottom surface to a high value to reduce the collector resistance.

Third, the capacitance between the collector and the substrate can be set to a small value because a relatively thick insulator layer can be interposed between the collector layer and the substrate, thereby making it possible to realize a high-speed operation of the transistor.

Fourth, the interconnection between the collector layer and the collector electrode can be formed in the process of bonding the substrate, and it is unnecessary to carry out an independent process for coupling the collector to the collector electrode.

Fifth, when a through hole is formed from a surface of the substrate and opposite the transistor region, it is possible to make electrical contact to the collector layer via the through hole. In this case, it becomes possible to supply a power source voltage from the back side of the stacked structure. As a result, the margin of the current capacity of the interconnection is improved, and the interference between the power line and the signal line can be prevented.

Figure 4:
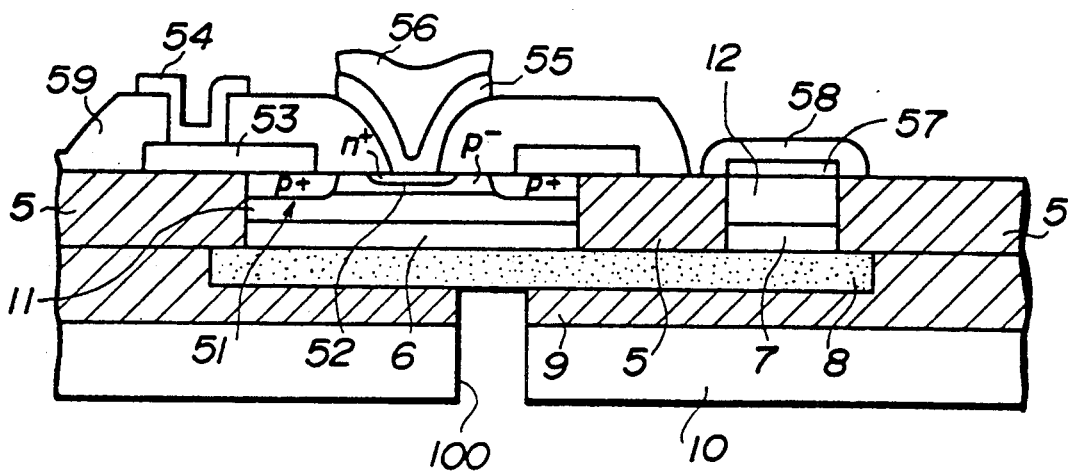
FIG. 4 is a cross sectional view showing a modification of the embodiment shown in FIG. 3.

FIG. 4 shows a modification of the embodiment, in which such a through hole 100 is formed. In FIG. 4, those parts which are the same as those corresponding parts in FIG. 3 are designated by the same reference numerals, and a description thereof will be omitted. The through hole 100 may be formed by a known method so that the through hole 100 penetrates the silicon substrate 10 and exposes the polysilicon layer 8.

Sixth, it is unnecessary to provide a device isolation means, such as a U-groove and a pn junction and which must be positioned with high accuracy.

Seventh, since the present invention does not use a LOCOS type field oxide layer, it is possible to reduce the collector-base capacitance. In addition, the widths of the transistor region and the collector electrode region can be controlled with a high accuracy.

Eighth, when the low resistance layer for coupling the collector layer and the collector electrode is patterned, it is possible to use the patterned low resistance layer for coupling the collector layer to other circuit elements so that a layer providing for multi-level interconnections may be omitted.

Further, the present invention is not limited to these embodiments, but various variations and modifications may be made without departing from the scope of the present invention.

What is claimed is:

1. A semiconductor device comprising:
   an insulating support layer having upper and lower main surfaces and a recessed portion in the upper main surface thereof;
   a conductive layer, supported in the recessed portion of the insulating support layer, having an upper main surface in a common plane with the upper main surface of the insulating support layer and defining, therewith, a support surface and having a lower main surface;
   a buried layer of conductive material having upper and lower main surfaces and comprising first and second spaced portions, the respective lower surfaces of the first and second portions of the buried layer being supported on the support surface and at least corresponding portions of the respective lower surfaces being supported on the upper surface of the conductive layer at spaced locations and defining at least a first, remaining exposed surface portion of the conductive layer extending between the spaced first and second portions of the buried layer;

a semiconductor single crystal layer having upper and lower main surfaces and comprising first and second spaced portions supported at the corresponding lower surfaces thereof on the corresponding upper surfaces of the respective first and second portions of the buried layer, the respective first portions having a common sidewall defining the periphery thereof and comprising a transistor region and the respective second portions having a common sidewall defining the periphery thereof and comprising a collector electrode region; and an insulating layer having an upper main surface lying in a common plane with the upper main surface of the semiconductor single crystal layer and having a lower main surface, supported on the support surface, comprising at least a first portion supported at the lower main surface thereof on the first remaining exposed surface portion of the upper main surface of the conductive layer and extending between the opposed portions of the respective sidewalls of the transistor and collector electrode regions.

2. The semiconductor device recited in claim 1, wherein:

the conductive layer includes at least a second, remaining exposed surface portion extending outwardly from the remaining portions of the sidewalls of the transistor and collector electrode regions; and the insulating layer further comprises at least a second portion supported at the lower main surface thereof on the remaining exposed surface portion of the conductor layer and engaging and extending from the remaining portions of the respective sidewalls of the transistor and collector electrode regions.

3. The semiconductor device recited in claim 1, wherein the conductive layer comprises a material selected from the group consisting of polysilicon, doped titanium silicide, titanium, tungsten, tantalum and tantalum silicide, 4. The semiconductor device recited in claim 1, wherein:

the first portion of the buried layer comprises a collector connection region of a transistor; and the second portion of the buried layer comprises a collector electrode connection region; and the conductive layer electrically interconnects the collector connection region and the electrode connection region and, further, comprises an electrical interconnection layer.

5. The semiconductor device recited in claim 1, wherein the insulating support layer comprises:

a first layer, of a semiconductor material, having upper and lower main surfaces; and a second layer, of an insulating material, having an upper surface comprising the upper main surface of the insulating support layer and a lower surface, bonded on the upper main surface of the first layer of semiconductor material.

6. The semiconductor device recited in claim 5, further comprising a through hole extending through the first layer of semiconductor material and the second layer of insulating material to, and exposing a corresponding surface portion of, the lower surface of the conductive layer.

7. The semiconductor device recited in claim 1, further comprising a through hole extending through the insulating support layer to and exposing a corresponding surface portion of the lower main surface of the conductive layer.

* * * * *

UNITED STATES PATENT AND TRADEMARK OFFICE
CERTIFICATE OF CORRECTION

PATENT NO. : 5,323,055
DATED : June 21, 1994
INVENTOR(S) : YAMAZAKI

It is certified that error appears in the above-indentified patent and that said Letters Patent is hereby corrected as shown below:

Title page, item [54] line 3, change "LAYER" to --LAYERS--.

Col. 1, line 3 (second line of title), change "LAYER" to --LAYERS--.

Col. 4, line 28, after "(i.e." insert --,--;
line 32, change "surface)" to --surfaces)--;
line 41, change "etching" to --etched--.

Col. 5, line 3, delete "an".

Col. 8, line 9, change "," to --.--.

Signed and Sealed this

Sixth Day of December, 1994

Attest:

BRUCE LEHMAN

Attesting Officer

Commissioner of Patents and Trademarks